United States Patent
Ahn et al.

(10) Patent No.: US 11,756,197 B2
(45) Date of Patent: Sep. 12, 2023

(54) SYSTEMS AND METHODS OF PROCESSING MAGNETIC RESONANCE IMAGES USING PHASE-SENSITIVE STRUCTURAL SIMILARITY INDEX MEASURE

(71) Applicant: GE PRECISION HEALTHCARE LLC, Wauwatosa, WI (US)

(72) Inventors: Sangtae Ahn, Guilderland, NY (US); Uri Wollner, Ramat Gan (IL); Graeme C. Mckinnon, Hartland, WI (US); Rafael Shmuel Brada, Hod-Hasharon (IL); Christopher Judson Hardy, Schenectady, NY (US)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 441 days.

(21) Appl. No.: 17/197,854

(22) Filed: Mar. 10, 2021

(65) Prior Publication Data

US 2022/0292679 A1    Sep. 15, 2022

(51) Int. Cl.
*G06K 9/00* (2022.01)
*G06T 7/00* (2017.01)
(Continued)

(52) U.S. Cl.
CPC ............ *G06T 7/0014* (2013.01); *G06N 3/08* (2013.01); *G06V 10/60* (2022.01);
(Continued)

(58) Field of Classification Search
CPC . G06T 2207/10088; G06T 2207/10092; G06T 2207/10096; G06T 11/003;
(Continued)

(56) References Cited

U.S. PATENT DOCUMENTS 3,103,005 A1  1/2012  Goodwin et al.
8,326,046 B2  12/2012  Rezazadeh et al.
(Continued)

OTHER PUBLICATIONS

Wang et al., "Image quality assessment: from error visibility to structural similarity." IEEE Trans Image Process 2004; 13(4): pp. 600-612.
(Continued)

*Primary Examiner* — Atiba O Fitzpatrick
(74) *Attorney, Agent, or Firm* — Armstrong Teasdale LLP

(57) ABSTRACT

A computer-implemented method of processing complex magnetic resonance (MR) images is provided. The method includes receiving a pair of corrupted complex data and pristine complex images. The method also includes training a neural network model using the pair by inputting the corrupted complex data to the neural network model, setting the pristine complex images as target outputs, and processing the corrupted complex data using the neural network model to derive output complex images of the corrupted complex data. Training a neural network model also includes comparing the output complex images with the target outputs by computing a phase-sensitive structural similarity index measure (PS-SSIM) between each of the output complex images and its corresponding target complex image, wherein the PS-SSIM is real-valued and varies with phases of the output complex image and phases of the target complex image, and adjusting the neural network model based on the comparison.

20 Claims, 9 Drawing Sheets

(51) Int. Cl.
  *G06N 3/08* (2023.01)
  *G06V 10/60* (2022.01)
(52) U.S. Cl.
  CPC ............... *G06T 2207/10081* (2013.01); *G06T 2207/10088* (2013.01); *G06T 2207/20081* (2013.01); *G06T 2207/30016* (2013.01)
(58) Field of Classification Search
  CPC .... G06T 11/005; G06T 11/006; G06T 11/008; G06T 2211/40; G06T 2211/421; G06T 2211/428; G06T 2211/432; G06T 2211/436; G06T 2211/424; G06T 2211/404; G06T 2211/408; G06T 2211/412; G06T 2211/416; G06T 2200/04; G06T 2207/10072–10128; G06T 2207/20081; G06T 2207/20084; G06T 7/0014; G06T 7/248; G06T 7/74; G06K 9/6256; G06K 9/6257; G06K 9/6259; G06V 10/70; G06V 10/82; G06V 10/774–7796; G06V 10/443; G06N 3/02–126; G06N 20/00–20; G06F 18/214–2155; G06F 7/023; G06F 40/16
  See application file for complete search history.

(56) References Cited

U.S. PATENT DOCUMENTS

| | | | |
|---|---|---|---|
| 3,515,181 A1 | 8/2013 | Rezazadeh et al. | |
| 8,532,396 B2 | 9/2013 | Rezazadeh et al. | |
| 8,660,363 B2 | 2/2014 | Rezazadeh et al. | |
| 8,660,364 B2 | 2/2014 | Rezazadeh et al. | |
| 8,983,206 B2 | 3/2015 | Coulombe et al. | |
| 2019/0333199 A1* | 10/2019 | Ozcan | G06T 3/4046 |
| 2020/0034998 A1* | 1/2020 | Schlemper | G06F 17/18 |
| 2020/0289019 A1* | 9/2020 | Schlemper | G06N 3/088 |
| 2021/0123999 A1* | 4/2021 | An | G01R 33/567 |
| 2022/0287671 A1* | 9/2022 | Huang | G06N 3/045 |
| 2022/0413074 A1* | 12/2022 | Nehrke | G06N 3/084 |

OTHER PUBLICATIONS

Wang et al., "Translation insensitive image similarity in complex wavelet domain." Proceedings of IEEE ICASSP, 2005; 2: pp. 573-576.
Samptat et al., "Complex Wavelet Structural Similarity: A New Image Similarity Index." IEEE Trans Image Process 2009; 18(11): pp. 2385-2401.
Degani, "Biomedical Applications of Holographic Microscopy Master dissertation." 2018; MIT.
Li et al., "Depth Image Quality Assessment for View Synthesis Based on Weighted CVPRW." 2019. Paper.
Katkovnik et al., "Computational super-resolution phase retrieval from multiple phase-coded diffraction patterns: simulation study and experiments." Optica 4, 2017; pp. 786.
Shevkunov et al., "Superresolution microscopy for biological specimens: lensless phase retrieval in noisy conditions." Biomed. Opt. Express 9, 2018; 5511, pp. 21.
Bertolotti et al., "Non-invasive imaging through opaque scattering layers." Nature 491, 2012; pp. 232-234.
Katz et al., "Non-invasive singleshot imaging through scattering layers and around corners via speckle correlations." Nat. Photon. 8, 2014; pp. 784-790.
Okamoto et al., "Noninvasive three-dimensional imaging through scattering media by three-dimensional speckle correlation." Opt. Lett. 44, 2019; pp. 2526.
Horisaki et al., "Single-shot noninvasive three-dimensional imaging through scattering media." Opt. Lett. 44, 2019; pp. 4032-4035.
Maleki et al., "Phase-retrieval and intensity-only reconstruction algorithms for optical diffraction tomography." J. Opt. Soc. Am. A 10, 1993; pp. 1086-1092.
Marathe et al. "Coherent diffraction surface imaging in refection geometry." Opt. Express 18, 2010; pp. 7253.
Burvall et al., "Phase retrieval in X-ray phase-contrast imaging suitable for tomography." Opt. Express 19, 2011; pp. 10359.
Latychevskaia et al., "When holography meets coherent diffraction imaging." Opt. Express 20, 2012; pp. 28871.
Rivenson, et al., "Phase recovery and holographic image reconstruction using deep learning in neural networks." University of California Los Angeles, pp. 1-30.
Cuche et al., "Digital holography for quantitative phase-contrast imaging." Opt. Lett. 24, 1999; pp. 291-293.
Mann et al., "High-resolution quantitative phase-contrast microscopy by digital holography." Opt. Express 13, 2005; pp. 8693.
Xia et al., "Improvement of color reproduction in color digital holography by using spectral estimation technique." Appl. Opt. 50, 2011; pp. H177.
Wang et al., "CSR-Net: A Novel Complex-Valued Network for Fast and Precise 3-D Microwave Sparse Reconstruction." IEEE Journal of Selected Topics in Applied Earth Observations and Remote Sensing, vol. 13, 2020; pp. 4476-4492.
Zhu et al. "A Lightweight Solution of Industrial Computed Tomography with Convolutional Neural Network." arxiv, 2020.
Fu et al., "A Deep Learning Reconstruction Framework Differentia;I Phase-Contrast Computed Tomography With Incomplete Data." IEEE Trans Image Process 2020; 9, pp. 2190-2202.
Malkiel et al., "Densely Connected Iterative Network for Sparse MRI Reconstruction." ISMRM 2018, p. 3363.
Rehman et al., "SSIM-Based Non-Local Means Image Denoising." Proceedings of 18th IEEE International Conference on Image Processing, 2018, pp. 217-220.
Rehman et al., "SSIM-inspired image restoration using sparse representation," EURASIP Journal on Advances in Signal Processing, 2012:16.

* cited by examiner

SYSTEMS AND METHODS OF PROCESSING MAGNETIC RESONANCE IMAGES USING PHASE-SENSITIVE STRUCTURAL SIMILARITY INDEX MEASURE

BACKGROUND

The field of the disclosure relates generally to systems and methods of image processing, and more particularly, to systems and methods of processing magnetic resonance (MR) images using a phase-sensitive structural similarity index measure.

Magnetic resonance imaging (MRI) has proven useful in diagnosis of many diseases. MRI provides detailed images of soft tissues, abnormal tissues such as tumors, and other structures, which cannot be readily imaged by other imaging modalities, such as computed tomography (CT). Further, MRI operates without exposing patients to ionizing radiation experienced in modalities such as CT and x-rays.

Compared to other imaging modalities, MRI is unusual in that an MRI signal is represented by a complex number, rather than a scalar or a real number. The image value for each image pixel, therefore, includes a magnitude and a phase. The phase of an MR image is often discarded, although it carries important information and may be used in many applications, especially in applications for estimating parameters that cannot be estimated with only the magnitude. The magnitude operation also changes the noise distribution and affects the image quality and estimation of parameters using MR images.

BRIEF DESCRIPTION

In one aspect, a computer-implemented method of processing complex magnetic resonance (MR) images is provided. The method includes receiving a pair of corrupted complex data and pristine complex images corresponding to the corrupted complex data. The method also includes training a neural network model using the pair of corrupted complex data and pristine complex images by inputting the corrupted complex data to the neural network model, setting the pristine complex images as target outputs of the neural network model, and processing the corrupted complex data using the neural network model to derive output complex images of the corrupted complex data. Training a neural network model also includes comparing the output complex images with the target outputs by computing a phase-sensitive structural similarity index measure (PS-SSIM) between each of the output complex images and its corresponding target complex image, wherein the PS-SSIM is real-valued and varies with phases of the output complex image and phases of the target complex image, and adjusting the neural network model based on the comparison.

In another aspect, an image processing system is provided. The system includes an image processing computing device, the image processing computing device including at least one processor in communication with at least one memory device. The at least one processor is programmed to receive a pair of corrupted complex data and pristine complex images corresponding to the corrupted complex data. The at least one processor is also programmed to train a neural network model using the pair of corrupted complex data and pristine complex images by inputting the corrupted complex data to the neural network model, setting the pristine complex images as target outputs of the neural network model, and processing the corrupted complex data using the neural network model to derive output complex images of the corrupted complex data. The at least one processor is further programmed to train a neural network model by comparing the output complex images with the target outputs by computing a PS-SSIM between each of the output complex images and its corresponding target complex image, wherein the PS-SSIM is real-valued and varies with phases of the output complex image and phases of the target complex image. The at least one processor is further programmed to train a neural network model by adjusting the neural network model based on the comparison.

In yet another aspect, an image processing system is provided. The system includes an image processing computing device, the image processing computing device including at least one processor in communication with at least one memory device. The at least one processor is programmed to receive crude complex data. The at least one processor is also programmed to process the crude complex data using a neural network model, wherein the neural network model was trained with a pair of corrupted complex data and pristine complex images with the corrupted complex data as inputs and the pristine complex images as target outputs, and a loss function of the neural network model that compares outputs of the neural network model and the target outputs of the neural network model includes a PS-SSIM between each of the output complex images and its corresponding target complex image, wherein the PS-SSIM is real-valued and varies with phases of the output complex image and phases of the target complex image. The at least one processor is further programmed to generate a predicted image of the crude complex data based on the processing and output the predicted image.

DETAILED DESCRIPTION

The disclosure includes systems and methods of processing magnetic resonance (MR) images using a phase-sensitive structural similarity index measure (PS-SSIM). A structural similarity index measure (SSIM) measures similarity between two images, and is an important metric in image processing. Unlike conventional SSIMs, which are based on the assumption that images are real-valued and are not affected by phases of the images, PS-SSIMs disclosed herein vary with the phases of the images. For the purpose of detailed description, MR images are used herein as examples only. The systems and methods described herein, however, are not limited to use in MR systems and being applied to MR images, and may be applied to images in general that are represented by complex numbers. For example, the systems and methods disclosed herein may be applied to phase contrast microscopy, synthetic aperture radar, fringe pattern analysis, lensless imaging and speckle-correlation imaging, diffraction imaging, holographic interferometry, electronic speckle pattern interferometry, microwave sparse reconstruction, and computed tomography (CT). As used herein, a complex image is an image represented by a complex number at each pixel, and complex data are data represented by a complex number at each data point. Method aspects will be in part apparent and in part explicitly discussed in the following description.

In magnetic resonance imaging (MRI), a subject is placed in a magnet. When the subject is in the magnetic field generated by the magnet, magnetic moments of nuclei, such as protons, attempt to align with the magnetic field but precess about the magnetic field in a random order at the nuclei's Larmor frequency. The magnetic field of the magnet is referred to as B0 and extends in the longitudinal or z direction. In acquiring an MRI image, a magnetic field (referred to as an excitation field B1), which is in the x-y plane and near the Larmor frequency, is generated by a radio-frequency (RF) coil and may be used to rotate, or "tip," the net magnetic moment Mz of the nuclei from the z direction to the transverse or x-y plane. A signal, which is referred to as an MR signal, is emitted by the nuclei, after the excitation signal B1 is terminated. To use the MR signals to generate an image of a subject, magnetic field gradient pulses (Gx, Gy, and Gz) are used. The gradient pulses are used to scan through the k-space, the space of spatial frequencies or inverse of distances. A Fourier relationship exists between the acquired MR signals and an image of the subject, and therefore the image of the subject can be derived by reconstructing the MR signals.

Figure 1:
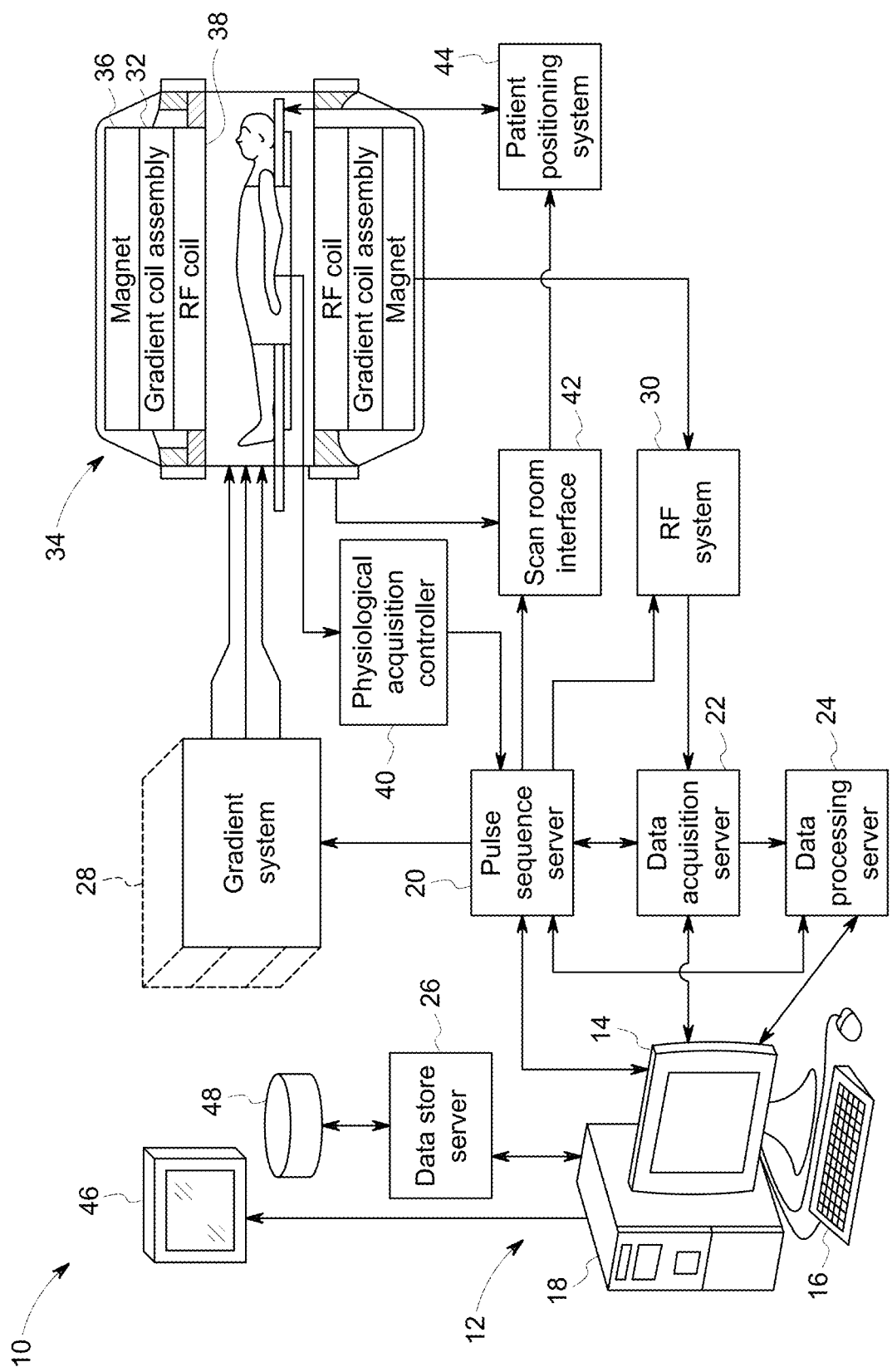
FIG. 1 is a schematic diagram of an exemplary magnetic resonance imaging (MRI) system.

FIG. 1 illustrates a schematic diagram of an exemplary MRI system 10. In the exemplary embodiment, the MRI system 10 includes a workstation 12 having a display 14 and a keyboard 16. The workstation 12 includes a processor 18, such as a commercially available programmable machine running a commercially available operating system. The workstation 12 provides an operator interface that allows scan prescriptions to be entered into the MRI system 10. The workstation 12 is coupled to a pulse sequence server 20, a data acquisition server 22, a data processing server 24, and a data store server 26. The workstation 12 and each server 20, 22, 24, and 26 communicate with each other.

In the exemplary embodiment, the pulse sequence server 20 responds to instructions downloaded from the workstation 12 to operate a gradient system 28 and a radiofrequency ("RF") system 30. The instructions are used to produce gradient and RF waveforms in MR pulse sequences. An RF coil 38 and a gradient coil assembly 32 are used to perform the prescribed MR pulse sequence. The RF coil 38 is shown as a whole body RF coil. The RF coil 38 may also be a local coil that may be placed in proximity to the anatomy to be imaged, or a coil array that includes a plurality of coils.

In the exemplary embodiment, gradient waveforms used to perform the prescribed scan are produced and applied to the gradient system 28, which excites gradient coils in the gradient coil assembly 32 to produce the magnetic field gradients $G_x$, $G_y$, and $G_z$ used for position-encoding MR signals. The gradient coil assembly 32 forms part of a magnet assembly 34 that also includes a polarizing magnet 36 and the RF coil 38.

In the exemplary embodiment, the RF system 30 includes an RF transmitter for producing RF pulses used in MR pulse sequences. The RF transmitter is responsive to the scan prescription and direction from the pulse sequence server 20 to produce RF pulses of a desired frequency, phase, and pulse amplitude waveform. The generated RF pulses may be applied to the RF coil 38 by the RF system 30. Responsive MR signals detected by the RF coil 38 are received by the RF system 30, amplified, demodulated, filtered, and digitized under direction of commands produced by the pulse sequence server 20. The RF coil 38 is described as a transmitter and receiver coil such that the RF coil 38 transmits RF pulses and detects MR signals. In one embodiment, the MRI system 10 may include a transmitter RF coil that transmits RF pulses and a separate receiver coil that detects MR signals. A transmission channel of the RF system 30 may be connected to a RF transmission coil and a receiver channel may be connected to a separate RF receiver coil. Often, the transmission channel is connected to the whole body RF coil 38 and each receiver section is connected to a separate local RF coil.

In the exemplary embodiment, the RF system 30 also includes one or more RF receiver channels. Each RF receiver channel includes an RF amplifier that amplifies the MR signal received by the RF coil 38 to which the channel is connected, and a detector that detects and digitizes the I and Q quadrature components of the received MR signal. The magnitude of the received MR signal may then be determined as the square root of the sum of the squares of the I and Q components as in Eq. (1) below:

$$M = \sqrt{I^2 + Q^2} \qquad (1);$$

and the phase of the received MR signal may also be determined as in Eq. (2) below:

$$\varphi = \tan^{-1}\left(\frac{Q}{I}\right). \qquad (2)$$

In the exemplary embodiment, the digitized MR signal samples produced by the RF system 30 are received by the data acquisition server 22. The data acquisition server 22 may operate in response to instructions downloaded from the workstation 12 to receive real-time MR data and provide buffer storage such that no data is lost by data overrun. In some scans, the data acquisition server 22 does little more than pass the acquired MR data to the data processing server 24. In scans that need information derived from acquired MR data to control further performance of the scan, however, the data acquisition server 22 is programmed to produce the needed information and convey it to the pulse sequence server 20. For example, during prescans, MR data is acquired and used to calibrate the pulse sequence performed by the pulse sequence server 20. Also, navigator signals may be acquired during a scan and used to adjust the operating parameters of the RF system 30 or the gradient system 28, or to control the view order in which k-space is sampled.

In the exemplary embodiment, the data processing server 24 receives MR data from the data acquisition server 22 and processes it in accordance with instructions downloaded from the workstation 12. Such processing may include, for example, Fourier transformation of raw k-space MR data to produce two or three-dimensional images, the application of filters to a reconstructed image, the performance of a back-projection image reconstruction of acquired MR data, the generation of functional MR images, and the calculation of motion or flow images.

In the exemplary embodiment, images reconstructed by the data processing server 24 are conveyed back to, and stored at, the workstation 12. In some embodiments, real-time images are stored in a database memory cache (not shown in FIG. 1), from which they may be output to operator display 14 or a display 46 that is located near the magnet assembly 34 for use by attending physicians. Batch mode images or selected real time images may be stored in a host database on disc storage 48 or on a cloud. When such images have been reconstructed and transferred to storage, the data processing server 24 notifies the data store server 26. The workstation 12 may be used by an operator to archive the images, produce films, or send the images via a network to other facilities.

Complex MR images may be reconstructed based on I and Q quadrature MR signals, using processes such as Fourier transform. Complex MR images $\hat{\rho}(x,y)$ are MR images with each pixel represented by a complex number, which has a real component $\text{Re}(\hat{\rho}(x,y))$ and an imaginary component $\text{Im}(\hat{\rho}(x,y))$, where $(x, y)$ is the location of the pixel in an image. Magnitude of a complex MR image, referred to as a magnitude image, is generated as $|\hat{\rho}(x, y)|= \sqrt{\text{Re}(\hat{\rho}(x,y))^2 + \text{Im}(\hat{\rho}(x,y))^2}$. A phase image, phase of a complex MR image, may also be generated and used, where phase $$\Phi(x, y) = \tan^{-1}\left(\frac{\text{Im}(\hat{\rho}(x, y))}{\text{Re}(\hat{\rho}(x, y))}\right).$$

A real image is an MR image with the value at each pixel as the real component $\text{Re}(\hat{\rho}(x,y))$. An imaginary image is an MR image with the value at each pixel as the imaginary component $\text{Im}(\hat{\rho}(x,y))$.

Compared to magnitude images, phase images are not often used because complex MR signals are often contaminated by undesired static and dynamic background phase variations caused by magnet and gradient imperfections, physiological noise such as cardiac and respiratory motion, and the object's intrinsic magnetic susceptibilities, particularly exacerbated near interfaces between air and tissue. Phase images therefore are often discarded, and only magnitude images are used. The magnitude operation, however, changes the noise distribution from a central Gaussian distribution with zero expectation value to a non-central chi square noise distribution with a positive expectation value. As a result, the magnitude operation causes an overestimation of the signal and introduces significant bias in the derived quantitative maps, especially in signal to noise ratio (SNR)-starved applications. Further, the dynamic range of an image in low SNR applications is irreversibly reduced by the magnitude operation, reducing efficiency of improving SNR by averaging multiple magnitude images. Averaging in the complex domain is not always feasible because inconsistent background phase may lead to signal cancellation or destructive interference.

In addition, certain types of information can be encoded in the image phase. As discussed above, magnetic moments of nuclei precess about the magnetic field at the nuclei's Larmor frequency. The Larmor frequency depends on the nuclei, and the local magnetic field experienced by the nuclei. Phase information results from the time evolution of Larmor frequency shifts of the nuclei. Local magnetic field shifts could result from different chemical species, such as fat and water, or from local/non-local magnetic susceptibilities. Local magnetic field may be affected by motion in a bulk or microscopic level like diffusion, gradients, and susceptibilities. Phase images represent this frequency information of voxels in the object. Therefore, in applications for measuring parameters that are related to phase, such as phase-contrast flow assessment and susceptibility quantification, phase images are preserved and used to fit signal models and derive maps. In these applications, the goodness of the fit hinges on the quality of phase estimates. Accordingly, in evaluating performance of image processing, the comparison of complex images should include phase differences.

An SSIM is a quantitative measure of the difference between two images. SSIM is known to reflect human visual perception of image differences better than more conventional metrics such as mean square error. SSIM has been used for evaluating the perceived quality of an image by calculating SSIM between the image to be assessed and the corresponding distortion-free image. SSIM has also been used as a loss function for training neural networks in deep learning. A loss function is a function measuring the inference error by a neural network model with respect to one data point in a training dataset, which is the error between the output of the neural network model and the ground truth/target output. When used as a loss function, an SSIM is calculated between a network output image and the corresponding target image or ground truth image.

Conventional SSIM, however, is based on the assumption that the images are real-valued, and the resultant SSIM value for such images is a real number between −1 and 1, inclusive. If conventional SSIMs were calculated for complex images by computing real components and imaginary components (or magnitude and phases) separately, the resultant SSIM value would be a complex number. A complex SSIM is not useful for comparison purposes because a complex value is non-intuitive and complex numbers cannot be ordered.

When SSIM is calculated for complex MR images, magnitude images are usually used. However, potentially-important phase information is lost in the magnitude images. Furthermore, when SSIM is used as a loss function for deep learning, if only magnitude images are used, the opportunity to learn about phase from training data is missed, potentially resulting in suboptimal outcomes.

The systems and methods disclosed herein provide a PS-SSIM, taking into account the phase information of MR images and still outputting a real-valued SSIM. A PS-SSIM includes a complex luminance comparison function, a complex contrast comparison function, and a complex structure comparison function such that at least one of these terms varies with the phase of the input images. The three terms may be multiplied with weighting to derive a PS-SSIM. The complex luminance comparison function, the complex contrast comparison function, and the complex structure comparison function are based on complex means, complex standard deviations, and complex covariance of and between the compared pair of complex images. The PS-SSIM may be used for evaluating the quality of complex MR images in denoising, image restoration, and image registration, and also may be used as a loss function for training a neural network that reconstructs complex MR images or enhances the quality of complex MR images by denoising and/or reducing or removing artifacts. Denoising as used herein includes reducing or removing noise. Denoising may result in reducing or removing artifacts. The PS-SSIM also works for non-standard weighting amongst the luminance comparison function, contrast comparison function, and structure comparison function.

Figure 2A:
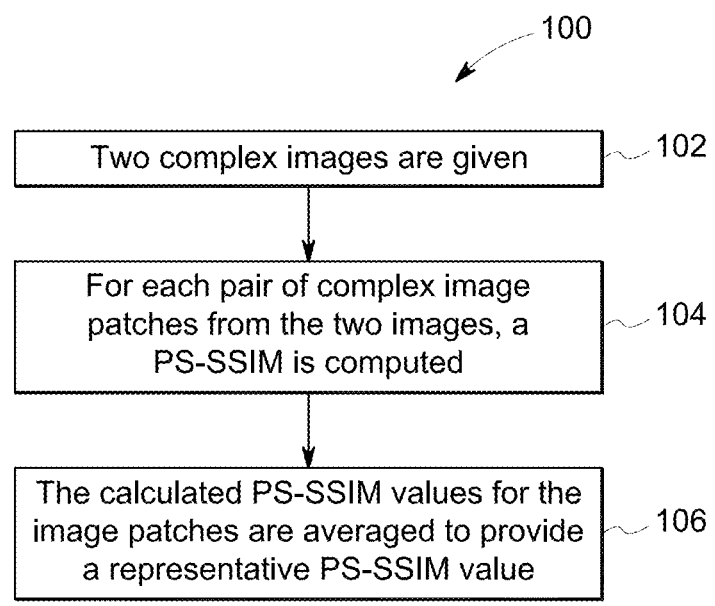
FIG. 2A is an exemplary image processing method using a phase-sensitive structural similarity index measure (PS-SSIM).

FIG. 2A is a flow chart of an exemplary image processing method 100. The method 100 is used to compute a PS-SSIM for two complex images. In the exemplary embodiment, the method 100 includes receiving 102 two complex images. Each of the complex images is divided into image patches. For example, the size of each image patch is 11×11, where 11 is the number of pixels in a row or column of the image patch. The size of image patches may be predetermined or based on a user input or selection. During computation of the PS-SSIM, a 11×11 window is moved in each of the two images. The image patches may be overlapping or non-overlapping. Computing PS-SSIM by pairs of image patches is used to focus on local similarities. The image patches in one image correspond to the image patches at the same pixel location in the other image. In other words, a pair of image patches, one in one of the images and the other in the other images, are moved in pairs during computation of PS-SSIM. In some embodiments, the two complex images are not divided into image patches in computing the PS-SSIM.

In the exemplary embodiment, the method 100 further includes, for each pair of complex image patches from the two images, calculating 104 a PS-SSIM between the pair of image patches. The calculated PS-SSIM values for the image patches are averaged 106 to provide a representative PS-SSIM value for the entire image.

Figure 2B:
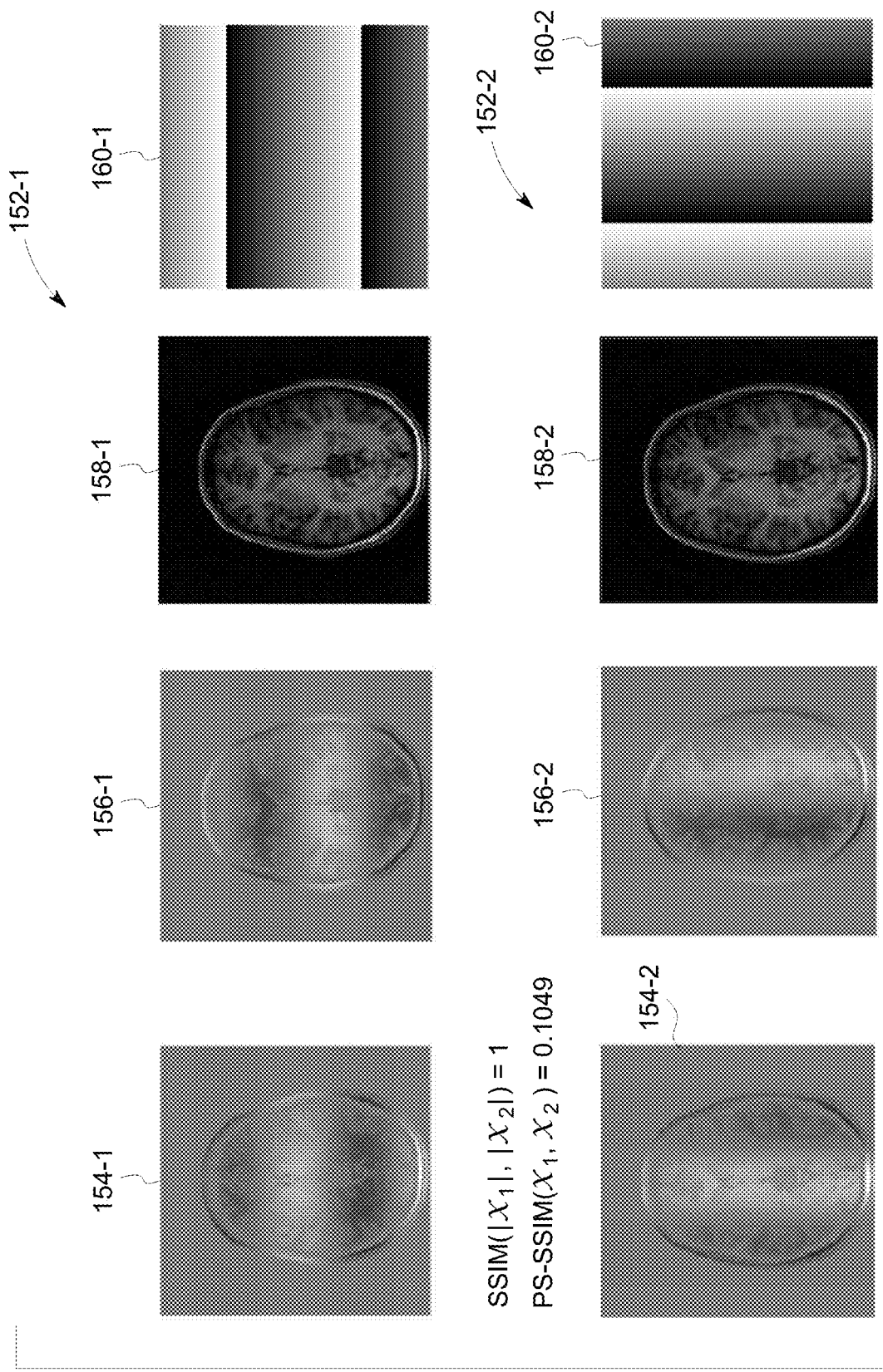
FIG. 2B is a comparison of a conventional structural similarity index measure (SSIM) and a PS-SSIM.

FIG. 2B illustrates a comparison of a conventional SSIM and PS-SSIM in measuring the similarity of two complex images 152-1, 152-2. The two complex images 152-1, 152-2 are illustrated in FIG. 2B with their respective real images 154-1, 154-2, imaginary images 156-1, 156-2, and magnitude images 158-1, 158-2, and phase images 160-1, 160-2. The complex images 152-1, 152-2 have identical magnitude images 158-1, 158-2. The phase images 160-1, 160-2 of the complex images 152-1, 152-2, however, are very different from each other. Because a conventional SSIM only considers the real-valued magnitude images 158-1, 158-2, the computed conventional SSIM of the two complex images 152-1, 152-2 is 1, indicating the complex images 152-1, 152-2 are the same. By contrast, the PS-SSIM considers the phases of the complex images 152-1, 152-2 and varies with the phases of the images. As a result, the computed PS-SSIM is 0.1049, indicating the two complex images 152-1, 152-2 are much different from one another.

A PS-SSIM for two complex image patches or images x and y includes a luminance comparison function l, a contrast comparison function c, and a structure comparison function s, and is defined as:

$$\text{PS-SSIM}(x,y) = l(x,y)^\alpha c(x,y)^\beta s(x,y)^\gamma, \quad (1)$$

where $\alpha$, $\beta$, and $\gamma$ are weights for the luminance comparison function l, the contrast comparison function c, and the structure comparison function s. The selection of the weights $\alpha$, $\beta$, and $\gamma$ depends on the user interest or application purpose in emphasizing among the luminance, contrast, and structure comparisons. In some embodiments, the weights $\alpha$, $\beta$, and $\gamma$ are equal. The $\alpha$, $\beta$, and $\gamma$ may be all equal to 1, which is equivalent to an unweighted product. Alternatively, a specific comparison function may be more weighted than the others. For example, a combination of $\alpha=0.3$, $\beta=1$, and $\gamma=0.3$ emphasizes the contrast comparison function. When used as a loss function for training a neural network for MR image reconstruction from undersampled k-space data, this combination of $\alpha$, $\beta$, and $\gamma$ may improve image sharpness.

In PS-SSIM, the luminance comparison function, the contrast comparison function, the structure comparison function, and the weights $\alpha$, $\beta$, and $\gamma$ are all real valued. As a result, PS-SSIM measures the similarity between the two complex images or image patches and provides a real-valued indicator. Unlike conventional SSIM, which measures similarity between real-valued images and is not affected by phases, PS-SSIM measures similarity between two complex images and is affected by phases of the images. In other words, a conventional SSIM does not change when the phases of the two images change, while PS-SSIM changes with the phases. For example, for MR complex images, their magnitude is usually used and the conventional SSIM is not affected by phases in the MR complex images. The value of PS-SSIM, however, changes when the phases of the MR complex images change.

In the exemplary embodiment, in designing the luminance comparison function, the contrast comparison function, and the structure comparison function, conditions are set for these functions, respectively. For example, the conditions are:

1. the luminance comparison function:
   a) is real valued,
   b) reaches its maximum value if the means of the image patches are equal and/or if the means of the real components of the image patches are equal and the means of the imaginary components of the image patches are equal, and
   c) varies with the phases of the image patches.
2. The contrast comparison function:
   a) is real valued,
   b) reaches its maximum value if the standard deviations of the image patches are equal and/or if the standard deviations of the real components of the image patches are equal and the standard deviations of the imaginary components of the image patches are equal, and
   c) varies with the phases of the image patches.
3. The structure comparison function:
   a) is real valued,
   b) reaches its maximum when the real components of the image patches are linearly dependent and the imaginary components of the image patches are linearly dependent and/or the real components of the image patches are positively fully correlated and the imaginary components of the image patches are positively fully correlated, and
   c) varies with the phases of the image patches.

Real components of two image patches x and y are linearly dependent when for each pixel in the image patches, real components Re(x) of a first image patch x is a linear function of the real components Re(y) of the second image patch y at the same pixel location. That is, Re(x)=a1*Re(y)+b1, with a1 and b1 as constants. Similarly, imaginary components of image patches x and y are linearly dependent when for each pixel in the image patches, the imaginary components Im(x) of a first image patch x is a linear function of the imaginary components Im(y) of the second image patch y at the same pixel location. That is, Im(x)=a2*Im(y)+b2, with a2 and b2 as constants. a1 and a2 are not necessarily the same. b1 and b2 are not necessarily the same.

Real components of two image patches x and y are positively fully correlated when the cross correlation between real components Re(x) of a first image patch x and the real components Re(y) of the second image patchy is 1. That is, $\text{COV}(\text{Re}(x), \text{Re}(y)) = \sigma_{Re(x)}\sigma_{Re(y)}$, where COV(Re (x), Re(y)) is the covariance between the real components Re(x) and Re(y), and $\sigma_{Re(x)}$ and $\sigma_{Re(y)}$ are variances of the real components Re(x) and Re(y), respectively. Imaginary components of two image patches x and y are positively fully correlated when the (normalized) cross correlation between imaginary components Im(x) of a first image patch x and the imaginary components Im(y) of the second image patch is 1. That is, COV(Im(x), Im(y))=$\sigma_{Im(x)}\sigma_{Im(y)}$, where COV(Im(x), Im(y)) is the covariance between the imaginary components Im(x) and Im(y), and $\sigma_{Im(x)}$ and $\sigma_{Im(y)}$ are variances of the imaginary components Im(x) and Im(y), respectively.

More conditions may be added for the structure comparison function. For example, condition 3.d that the structure comparison reaches its maximum if the image patches are linearly dependent and/or if the image patches are positively fully correlated may be added. Two image patches x and y are linearly dependent when for each pixel in the image patches, each pixel of a first image patch x is a linear function of the pixel of the second image patch y at the same pixel location. That is, Re(x)+i Im(x)=a3*(Re(y)+i Im(y))+b3, where a3 and b3 are constants. a3 is not necessarily the same as a1 or a2. b3 is not necessarily the same as b1 or b2. Two image patches x and y are positively fully correlated when the (normalized) cross correlation between a first image patch x and the second image patch y is 1. That is, COV(x, y))=$\sigma_x\sigma_y$, where COV(x, y) is the covariance between the two image patches x and y, and $\sigma_x$ and $\sigma_y$ are variances of the image patches x and y, respectively. Exemplary computing methods of covariance and variances of complex images are described later in this document.

In another example, an additional condition is that the PS-SSIM is equivalent to the conventional SSIM if the image patches are real-valued. Conditions 1.a, 2.a, and 3.a for luminance, contrast, and structure comparison functions are to keep the comparison functions real-valued even when the images are complex-valued such that the PS-SSIM is real-valued as a direct quantitative indicator of the similarity between images. Conditions 1.b, 2.b, 3.b, and 3.d indicate the comparison functions are similarity metrics that measure the degree of similarity between the image patches and reach maximum values when the image patches are most similar under those conditions. Conditions 1.c, 2.c, and 3.c are to keep the comparison functions sensitive to the phases of image patches. If the comparison functions are based only on the magnitude of the complex-valued image patches, the comparison functions would be independent of the phases and conditions 1.c, 2.c, and 3.c would not be met. The values of luminance comparison functions may be scaled or shifted to lie within [0, 1].

In some embodiments, because MR phase images tend to be noisy and have a low level of signal and random phase, a PS-SSIM only taking account of phases may unduly overweight noise and dissimilarity between the phases, providing an unreliable indicator of the similarity between the complex images. Furthermore, because of these characteristics of phases of MR images, training of a neural network model with a loss function of a PS-SSIM that only takes account of phases may become unstable. Therefore, the PS-SSIM considers both real and imaginary components of images, or both the magnitude and phases of the images.

Exemplary PS-SSIMs

Let $\mu_{(\cdot)}$, $\sigma_{(\cdot)}$ and $\sigma_{(\cdot)(\cdot)}$ denote the mean, the standard deviation, and the covariance, respectively. That is, $$\mu_x = \frac{1}{N}\sum_i x_i \text{ and } \mu_y = \frac{1}{N}\sum_i y_i$$

are the means of the image patches x and y, respectively, where N is the number of pixels in the image patches. $\sigma_x = \sqrt{\mu_{|x-\mu_x|^2}} = \sqrt{\mu_{|x|^2}-|\mu_x|^2}$ and $\sigma_y=\sqrt{\mu_{|y-\mu_y|^2}}=\sqrt{\mu_{|y|^2}-|\mu_y|^2}$ are the standard deviations of the image patches x and y, respectively, where |•| denotes the magnitude or absolute value, and $\sigma_{xy}=\mu_{(x-\mu_x)(y-\mu_y)^*}=\mu_{xy^*}-\mu_x\mu_{y^*}$ is the covariance of the image patches x and y where (•)* denotes complex conjugate.

Luminance Comparison Function

A conventional luminance comparison function is given as:

$$l(x, y) = \frac{2\mu_x\mu_y + c_1}{\mu_x^2 + \mu_y^2 + c_1},$$

for a positive constant $c_1$. For example, one may set $c_1=(k_1L)^2$ where $k_1=0.01$ and L is the dynamic range. However, if x and y are complex-valued, the conventional luminance comparison function does not satisfy Condition 1.a because $\mu_x$ and $\mu_y$ may be complex-valued. Even if the conventional luminance comparison function is modified to meet Condition 1.a by using the magnitude images, |x| and |y|, as in $$l(x, y) = \frac{2\mu_{|x|}\mu_{|y|} + c_1}{\mu_{|x|}^2 + \mu_{|y|}^2 + c_1},$$

where $\mu_{|x|}$ and $\mu_{|y|}$ are the means of the magnitude images, |x| and |y|, respectively, Condition 1.c is not satisfied because the phase information is lost, that is, the luminance comparison function is independent of the phases of the images x and y.

An exemplary luminance comparison function that meets Conditions 1.a-c is:

$$l(x, y) = \frac{1}{2}\left(\frac{2\text{Re}\{\mu_x\mu_y^*\} + c_1}{|\mu_x|^2 + |\mu_y|^2 + c_1} + 1\right) = \frac{1}{2}\left(\frac{2(\text{Re}\{\mu_x\}\text{Re}\{\mu_y\} + \text{Im}\{\mu_x\}\text{Im}\{\mu_y\}) + c_1}{\mu_{Re(x)}^2 + \mu_{Im(x)}^2 + \mu_{Re(y)}^2 + \mu_{Im(y)}^2 + c_1} + 1\right),$$

where Re{•} and Im{•} denote real and imaginary components, respectively. It can be shown that this luminance comparison function satisfies Conditions 1.b, as follows. One may note that $|\mu_x-\mu_y|^2=|\mu_x|^2+|\mu_y|^2-2\text{Re}\{\mu_x\mu_y^*\}=|\mu_x|^2+|\mu_y|^2-2\text{Re}\{\mu_x\mu_{y^*}\}\geq 0$ where the equality holds if $\mu_x=\mu_y$. Therefore, $$\frac{2\text{Re}\{\mu_x\mu_{y^*}\} + c_1}{|\mu_x|^2 + |\mu_y|^2 + c_1} \leq 1$$

where the equality holds if $\mu_x=\mu_y$. It suffices to prove this luminance comparison function achieves its maximum value of 1 if $\mu_x=\mu_y$.

Another exemplary luminance comparison function that meets Conditions 1.a-c is:

$$l(x, y) = \frac{2\text{Re}\{\mu_x \mu_y^*\} + c_1}{|\mu_x|^2 + |\mu_y|^2 + c_1}.$$

One more exemplary luminance comparison function that meets Conditions 1.a-c is:

$$l(x, y) = \frac{2|\text{Re}\{\mu_x \mu_y^*\}| + c_1}{|\mu_x|^2 + |\mu_y|^2 + c_1} = \frac{2|\text{Re}\{\mu_x\}\text{Re}\{\mu_y\} + \text{Im}\{\mu_x\}\text{Im}\{\mu_y\}| + c_1}{\mu_{Re\{x\}}^2 + \mu_{Im\{x\}}^2 + \mu_{Re\{y\}}^2 + \mu_{Im\{y\}}^2 + c_1}.$$

The maximum of this luminance comparison function is achieved if $\mu_x = \mu_y$ or $\mu_x = -\mu_y$.

One more exemplary luminance comparison function that meets Conditions 1.a-c is:

$$l(x, y) = \left( \frac{2|\mu_{Re\{x\}}\mu_{Re\{y\}}| + c_1}{\mu_{Re\{x\}}^2 + \mu_{Re\{y\}}^2 + c_1} \right)\left( \frac{2|\mu_{Im\{x\}}\mu_{Im\{y\}}| + c_1}{\mu_{Im\{x\}}^2 + \mu_{Im\{y\}}^2 + c_1} \right).$$

The maximum of this luminance comparison function is achieved if $\mu_x = \mu_y$, $\mu_x = -\mu_y$, $\mu_x = \mu_y^*$, or $\mu_x = -\mu_y^*$.

More exemplary luminance comparison functions that satisfy Conditions 1.a-c include:

$$l(x, y) = \left| \text{Re}\left\{ \left( \frac{2\mu_x \mu_y^* + c_1}{|\mu_x|^2 + |\mu_y|^2 + c_1} \right)^\alpha \right\} \right|^{\frac{1}{\alpha}},$$

and $$l(x, y) = \left[ \frac{1}{2}\left( \text{Re}\left\{ \left( \frac{2\mu_x \mu_y^* + c_1}{|\mu_x|^2 + |\mu_y|^2 + c_1} \right)^\alpha \right\} + 1 \right) \right]^{\frac{1}{\alpha}}.$$

Contrast Comparison Function

An exemplary contrast comparison function that meets Conditions 2.a-c is:

$$c(x, y) = \frac{2\sigma_x \sigma_y + c_2}{\sigma_x^2 + \sigma_y^2 + c_2} = \frac{2\sqrt{(\sigma_{Re\{x\}}^2 + \sigma_{Im\{x\}}^2)(\sigma_{Re\{y\}}^2 + \sigma_{Im\{y\}}^2)} + c_2}{\sigma_{Re\{x\}}^2 + \sigma_{Re\{y\}}^2 + \sigma_{Im\{x\}}^2 + \sigma_{Im\{y\}}^2 + c_2},$$

where $\sigma_x = \sqrt{\overline{|\mu_{x-\mu_x}|^2}} = \sqrt{\overline{|\mu_x|^2} - |\mu_x|^2}$, and $c_2$ is a positive constant. For example, one may set $c_2 = (k_2 L)^2$ with $k_2 = 0.03$. One may note that $|\sigma_x - \sigma_y|^2 = \sigma_x^2 + \sigma_y^2 - 2\sigma_x \sigma_y \geq 0$ and therefore $$\frac{2\sigma_x \sigma_y + c_2}{\sigma_x^2 + \sigma_y^2 + c_2} \leq 1$$

where the equality holds if $\sigma_x = \sigma_y$. This contrast comparison function achieves its maximum value of 1 if $\sigma_x = \sigma_y$.

Another exemplary comparison function that meets Conditions 2.a-c is:

$$c(x, y) = \left( \frac{2\sigma_{Re\{x\}} \sigma_{Re\{y\}} + c_2}{\sigma_{Re\{x\}}^2 + \sigma_{Re\{y\}}^2 + c_2} \right)\left( \frac{2\sigma_{Im\{x\}} \sigma_{Im\{y\}} + c_2}{\sigma_{Im\{x\}}^2 + \sigma_{Im\{y\}}^2 + c_2} \right).$$

The maximum value of this contrast comparison function is achieved if $\sigma_{Re\{x\}} = \sigma_{Re\{y\}}$ and $\sigma_{Im\{x\}} = \sigma_{Im\{y\}}$.

If only the magnitudes $|x|$ and $|y|$ of the image patches are taken and used for calculating the conventional contrast comparison function as in $$c(x, y) = \frac{2\sigma_{|x|} \sigma_{|y|} + c_2}{\sigma_{|x|}^2 + \sigma_{|y|}^2 + c_2},$$

Condition 2.c is not met.

Structure Comparison Function

If only the magnitudes $|x|$ and $|y|$ of the image patches are taken and used for calculating the conventional structure comparison function as in:

$$s(x, y) = \frac{\sigma_{|x||y|} + c_3}{\sigma_{|x|} \sigma_{|y|} + c_3},$$

Condition 3.c is not met.

An exemplary structure comparison function that meets Conditions 3.a-d is:

$$s(x, y) = \frac{|\sigma_{xy}| + c_3}{\sigma_x \sigma_y + c_3} = \frac{\sqrt{(\sigma_{Re\{x\}Re\{y\}} + \sigma_{Im\{x\}Im\{y\}})^2 + (-\sigma_{Re\{x\}Im\{y\}} + \sigma_{Im\{x\}Re\{y\}})^2} + c_3}{\sqrt{(\sigma_{Re\{x\}}^2 + \sigma_{Im\{x\}}^2)(\sigma_{Re\{y\}}^2 + \sigma_{Im\{y\}}^2)} + c_3}$$

where $c_3$ is usually set to $c_2/2$. One may note $|\sigma_{xy}| \leq \sigma_x \sigma_y$ by the Cauchy-Schwarz inequality where the inequality holds if $x = ky$ for some constant $k$. This structure comparison function satisfies Conditions 3.b and 3.d.

Another exemplary structure comparison function that meet Conditions 3.a-d is $$s(x, y) = \frac{\sigma_{xy} + c_3}{\sigma_x \sigma_y + c_3}.$$

This structure comparison function achieves its maximum value if $x = ky$ for some $k > 0$.

One more exemplary structure comparison function that meet Conditions 3.a-c is $$s(x, y) = \left( \frac{|\sigma_{Re\{x\}Re\{y\}}| + c_3}{\sigma_{Re\{x\}} \sigma_{Re\{y\}} + c_3} \right)\left( \frac{|\sigma_{Im\{x\}Im\{y\}}| + c_3}{\sigma_{Im\{x\}} \sigma_{Im\{y\}} + c_3} \right).$$

One more exemplary structure comparison function that meets Conditions 3.a-c is $$s(x, y) = \left( \frac{1}{2}\left( \frac{\sigma_{Re\{x\}Re\{y\}} + c_3}{\sigma_{Re\{x\}} \sigma_{Re\{y\}} + c_3} + 1 \right) \right)\left( \frac{1}{2}\left( \frac{\sigma_{Im\{x\}Im\{y\}} + c_3}{\sigma_{Im\{x\}} \sigma_{Im\{y\}} + c_3} + 1 \right) \right).$$

Other exemplary structure comparison functions include:

$$s(x, y) = \frac{|\text{Re}\{\sigma_{xy}\}| + c_3}{\sigma_x \sigma_y + c_3} = \frac{|\sigma_{Re\{x\}Re\{y\}} + \sigma_{Im\{x\}Im\{y\}}| + c_3}{\sqrt{(\sigma_{Re\{x\}}^2 + \sigma_{Im\{x\}}^2)(\sigma_{Re\{y\}}^2 + \sigma_{Im\{y\}}^2)} + c_3},$$

-continued $$s(x, y) = \frac{1}{2}\left(\frac{\text{Re}\{\sigma_{xy}\} + c_3}{\sigma_x \sigma_y + c_3} + 1\right) = \frac{1}{2}\left(\frac{|\sigma_{Re\{x\}Re\{y\}} + \sigma_{Im\{x\}Im\{y\}}| + c_3}{\sqrt{(\sigma_{Re\{x\}}^2 + \sigma_{Im\{x\}}^2)(\sigma_{Re\{y\}}^2 + \sigma_{Im\{y\}}^2)} + c_3} + 1\right),$$

$$s(x, y) = \left|\text{Re}\left\{\left(\frac{\sigma_{xy} + c_3}{\sigma_x \sigma_y + c_3}\right)^{\gamma}\right\}\right|^{\frac{1}{\gamma}}, \text{ and}$$

$$s(x, y) = \left[\frac{1}{2}\left(\text{Re}\left\{\left(\frac{\sigma_{xy} + c_3}{\sigma_x \sigma_y + c_3}\right)^{\gamma}\right\} + 1\right)\right]^{1/\gamma}.$$

PS-SSIM(x, y) = l(x, y)$^{\alpha}$c(x, y)$^{\beta}$s(x, y)$^{\gamma}$ with $$l(x, y) = \frac{2\text{Re}\{\mu_x \mu_y^*\} + c_1}{|\mu_x|^2 + |\mu_y|^2 + c_1},$$

$$c(x, y) = \frac{2\sigma_x \sigma_y + c_2}{\sigma_x^2 + \sigma_y^2 + c_2},$$

and $$s(x, y) = \frac{\sigma_{xy} + c_3}{\sigma_x \sigma_y + c_3}$$

is an exemplary phase-sensitive SSIM that satisfies Conditions 1-3.

Figure 3A:
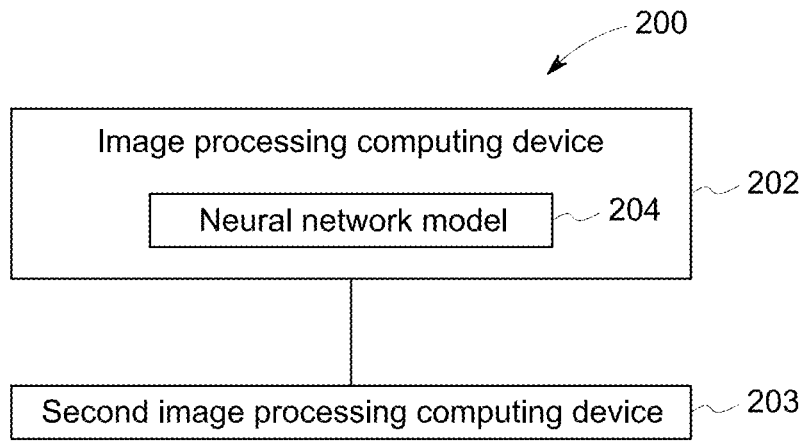
FIG. 3A is an exemplary image processing system that includes a neural network model.

FIG. 3A is a schematic diagram of an exemplary image processing system 200. In the exemplary embodiment, the system 200 includes an image processing computing device 202 configured to process complex images or data. The computing device 202 further includes a neural network model 204. The system 200 may include a second image processing computing device 203. The second image processing computing device 203 may be used to train the neural network model 204, and the image processing computing device 202 may then use the trained neural network model 204. The second image processing computing device 203 may be the same computing device as the image processing computing device 202 such that the training and use of the neural network model 204 are on one computing device. Alternatively, the second image processing computing device 203 may be a computing device separate from the image processing computing device 202 such that the training and use of the neural network model 204 are executed on separate computing devices. The image processing computing device 202 may be included in the workstation 12 of the MRI system 10, or may be included on a separate computing device that is in communication with the workstation 12.

Figure 3B:
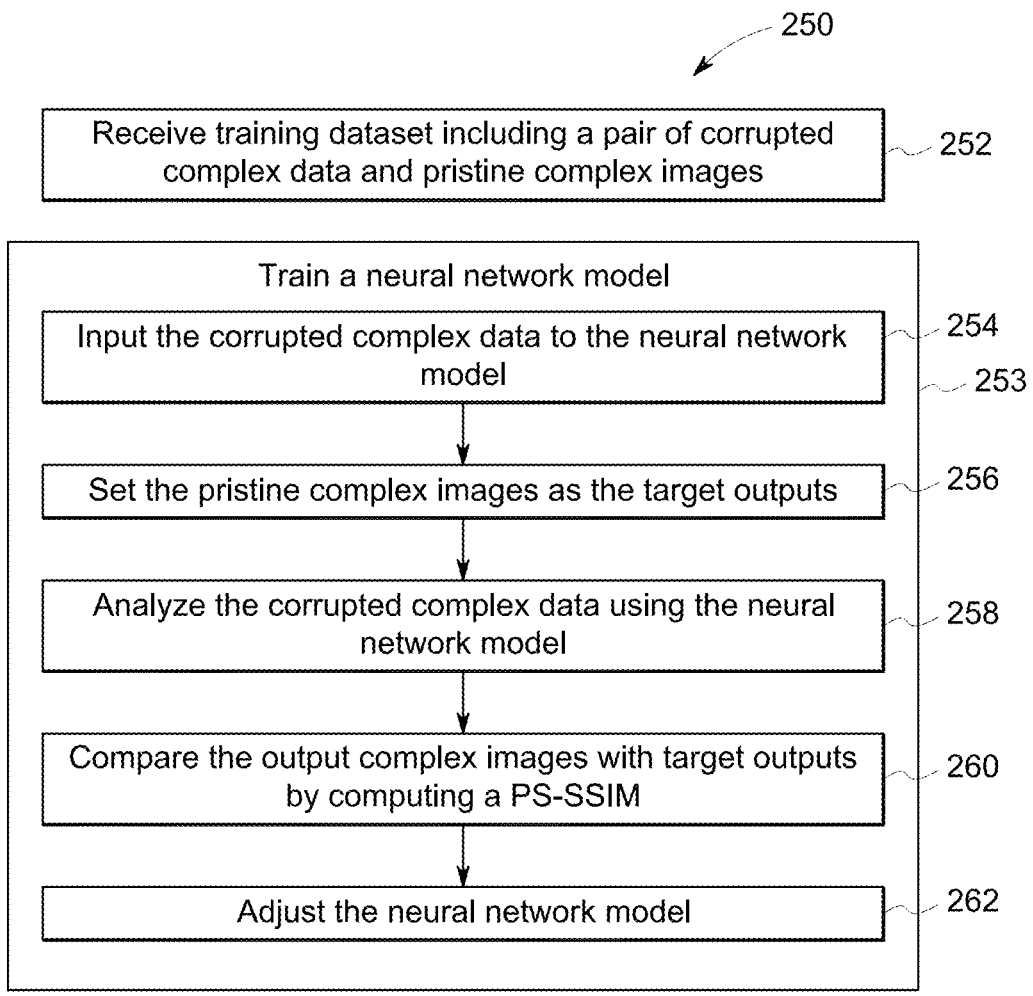
FIG. 3B is a flow chart of another exemplary image processing method that includes training the neural network model shown in FIG. 3A.

FIG. 3B is a flow chart of an exemplary method 250 of processing complex images using the PS-SSIM. In the exemplary embodiment, the method 250 includes receiving 252 a training dataset. The training dataset includes a pair of corrupted complex data and pristine complex images. Each pristine complex image corresponds to one of the corrupted complex data. Corrupted complex data may be a corrupted complex image or complex raw data from which complex images are reconstructed. Corresponding pristine complex image is an improved image of the corrupted image or the reconstructed image of the corrupted complex data. For example, compared to the corresponding pristine complex image, the corrupted complex image or the complex image reconstructed directly from the corrupted complex data has increased noise, artifacts, or distortion, and/or reduced resolution, contrast, or structures, or any combination thereof.

In one example, the corrupted complex data are MR signals of a subject from an undersampled k-space. As used herein, a subject is a human being, animal, phantom, or any object of which an MR image is acquired. The MR signals are used to reconstruct MR images of the subject. The corresponding pristine images are MR images of the subject based on fully-sampled k-space data. The corrupted complex data may be generated by downsampling the fully-sampled k-space data. In another example, corrupted complex data are noisy complex images and the pristine complex images are corresponding complex images with reduced or no noise. The corrupted complex data may be generated by adding noise to the pristine complex images. In one more example, corrupted complex data are MR images of the subject such as MR head images that include motion artifacts and corresponding pristine complex images are MR head images with reduced or no motion. Corrupted complex data may be generated by adding simulated motion-generated inconsistencies to the pristine images.

In the exemplary embodiment, the method 250 includes training 253 a neural network model 204. The neural network model 204 includes one or more transformation, such as image reconstruction, image registration, denoising, or image restoration. For example, the neural network model is configured to reconstruct MR signals into MR images, reduce noise in the MR images, or register MR images. Training 253 includes inputting 254 the corrupted complex data to the neural network model. Training 253 further includes setting 256 the pristine complex images as the target outputs of the neural network model. Training 253 also includes processing 258 the corrupted complex data using the neural network model to derive output complex images of the neural network model. For example, the output complex images may be reconstructed MR images based on the corrupted complex data, denoised MR images of the corrupted complex data, or registered MR images. Further, training 253 includes comparing 260 the output complex images with the target outputs by computing a PS-SSIM between each of the output complex image and its corresponding target output. The PS-SSIM may be any of the exemplary PS-SSIMs described above. The PS-SSIM is used as the cost function or part of the cost function for the neural network model 204. A cost function measures how well a neural network did with respect to all training inputs in a training dataset in comparison with target outputs. A cost function may be a sum of loss functions over the training dataset. A cost function is a function of the training inputs, target outputs, and parameters of the neural network model such as weights of the neurons in the neural network model. Training 253 also includes adjusting 262 the neural network model. For example, the weights of the neural network model may be adjusted to optimize the cost function. The trained neural network model 204 may then be used to process complex images or data.

Figure 3C:
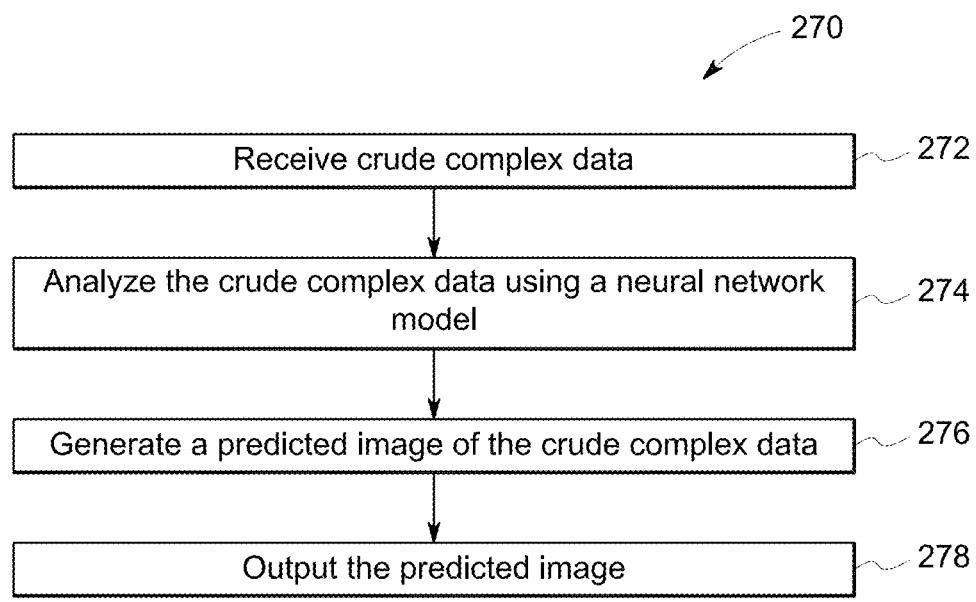
FIG. 3C is a flow chart of one more exemplary image processing method that includes using the neural network model shown in FIG. 3A.

FIG. 3C is a flow chart of another exemplary method 270 of processing complex images using PS-SSIM. Different from the method 250, the method 270 uses the trained neural network model 204 to process complex data or images. In the exemplary embodiment, the method 270 includes receiving 272 crude complex data. Crude complex data may be a corrupted complex image or complex raw data from which complex images are reconstructed. For example, the crude complex data may be complex k-space data or complex MR images. The crude complex data may be MR signals of a subject acquired by undersampling the k-space. In another example, crude complex data are noisy complex images. In one more example, crude complex data are MR images of the subject acquired when the subject was moving such as MR head images. The method 270 further includes processing 274 the crude complex data using the trained neural network model 204. The neural network model was trained using the method 250. The method 270 also includes deriving 276 a predicted image from the crude complex data based on the processing. The predicted image may be the output image of the neural network model 204 with the crude complex data as the input. Compared to the crude complex data or a complex image reconstructed directly from the crude complex data, the predicted complex image has reduced noise, artifacts, or distortion, and/or increased resolution, contrast, or structures, and any combination thereof. In addition, the method 270 includes outputting 278 the predicted image.

Figure 3D:
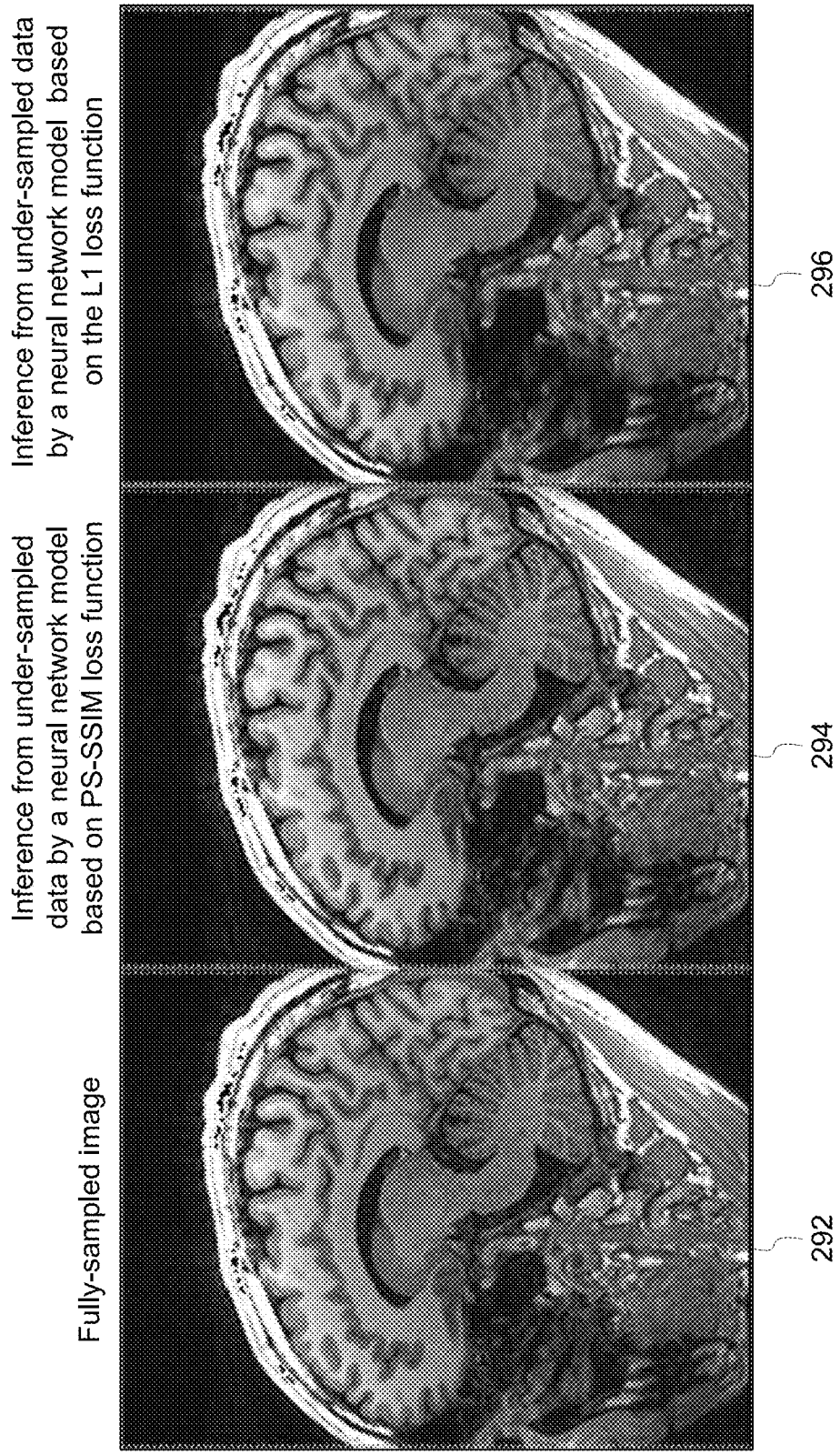
FIG. 3D is a comparison of an image reconstructed by the neural network model shown in FIG. 3A with an image reconstructed by a conventional neural network model.

FIG. 3D is a comparison of the neural network model 204 using a PS-SSIM as the loss function and a neural network model using a L1 loss function (referred to as an L1 neural network model), which is a sum of the absolute differences between the ground truth and the predicted values inferred by the neural network model. The input of both the neural network model 204 and the L1 neural network model is undersampled k-space data, where k-space is not sampled at all k-space locations corresponding to the desired image matrix size. In this example, the k-space data was undersampled with variable-density Poisson-disc sampling at the peripheral region of the k-space, and the k-space center region such as 1% of the k-space region around the center of the k-space was fully sampled. The net undersampling factor was 10. The image matrix size was 256×256. The neural network model 204 and the L1 neural network model both are a densely connected iterative network configured to reconstruct images from undersampled k-space data. The exemplary PS-SSIM used for training the neural network model 204 is as follows:

$$PS\text{-}SSIM(x, y) = l(x, y)^\alpha c(x, y)^\beta s(x, y)^\gamma,$$

where $\alpha = 0.3$, $\beta = 1$, $\gamma = 0.3$, $$l(x, y) = \frac{1}{2}\left(\frac{2\text{Re}\{\mu_x \mu_y^*\} + c_1}{|\mu_x|^2 + |\mu_y|^2 + c_1} + 1\right),$$

$$c(x, y) = \frac{2\sigma_x \sigma_y + c_2}{\sigma_x^2 + \sigma_y^2 + c_2},$$

and $$s(x, y) = \frac{|\sigma_{xy}| + c_3}{\sigma_x \sigma_y + c_3}.$$

In FIG. 3D, an image 292 is an image reconstructed based on fully-sampled image, where the image is based on MR signals or k-space data acquired by fully sampling the k-space. The image 292 is the ground truth. An image 294 is an image output by the neural network model 204. An image 296 is an image output by the L1 neural network model. The image 294 has discernible better image quality than the image 296, where the image 294 is sharper, have a higher contrast, finer structural details than the image 296. In addition, the image 294 is artifact-free, where the image 294 has reduced artifacts or does not have discernible artifacts, compared to the image 296, where the cerebellum in the image 296 is discernably blurred.

The neural network model 204 is compared with neural network models trained using other loss functions, such as L2, conventional SSIM, a perceptual loss function, or a generative adversarial network (GAN) loss function. The output image of the neural network model 204 is sharper and has a higher contrast than output images of other neural network models carrying out the same function and with the same input. The neural network model 204 is also more robust than such other neural models and does not introduce artifacts.

Image Denoising

The phase-sensitive SSIM (PS-SSIM) may be used for denoising complex-valued images without using a neural network model. An example of image denoising algorithm is non-local means (NLM). An NLM algorithm based on the phase-sensitive SSIM is described below.

Suppose v is a complex-valued noisy image to be denoised. A denoised image u may be calculated as:

$$u_i = \frac{1}{\sum_k w_{ik}} \sum_j v_j w_{ij},$$

where $u_i$ denotes pixel i of image u, $v_j$ denotes pixel j of image v, and $w_{ij}$ is a weight. The weight $w_{ij}$ may be calculated as:

$$w_{ij} = \text{PS-SSIM}(v^{(i)}, v^{(j)}),$$

where PS-SSIM(•,•) is the phase-sensitive SSIM, $v^{(i)}$ is an image patch centered around pixel i taken from image v, and $v^{(j)}$ is an image patch centered around pixel j taken from image v. If pixels i and j are distant, the weight $w_{ij}$ may be set to 0. For example, this is equivalent to calculating:

$$u_i = \frac{1}{\sum_{k \in N_i} w_{ik}} \sum_{j \in N_i} v_j w_{ij}$$

where $N_i$ denotes a search window, which is a set of pixels in a square centered around pixel i.

If the conventional SSIM is used, the weight is calculated as $w_{ij} = \text{SSIM}(|v^{(i)}|, |v^{(j)}|)$ where SSIM(•, •) is the conventional SSIM, $|v^{(i)}|$ is the magnitude image of $v^{(i)}$, and $|v^{(j)}|$ is the magnitude image of $v^{(j)}$. In this case, the phase of the image patches $v^{(i)}$ and $v^{(j)}$ is ignored in calculating the weight $w_{ij}$. Therefore, the denoising of the complex-valued image may be suboptimal because the phase information is discarded. In contrast, the PS-SSIM takes the phase information into account, yielding better results.

The procedure for NLM image denoising with PS-SSIM for complex-valued images is as follows. A complex-valued noisy image v to be denoised is given. For each pixel i, take an image patch $v^{(i)}$ centered around the pixel i from the image v. For each pixel j of a search window $N_i$ centered around the pixel i, take an image patch $v^{(j)}$ centered around the pixel j. Weight $w_{ij}$ is calculated by calculating PS-SSIM for image patches $v^{(i)}$ and $v^{(j)}$. $\mu_i$, pixel i of a denoised image, is calculated by calculating a weighted average of the noisy image v over the search window $N_i$ with the weight $w_{ij}$:

$$u_i = \frac{1}{\sum_{k \in N_i} w_{ik}} \sum_{j \in N_i} v_j w_{ij}.$$

A denoised image u that includes pixels $u_i$ is displayed.

Image Restoration

The phase-sensitive SSIM (PS-SSIM) may be used for image restoration. An example of image restoration algorithms is a dictionary-based sparse representation algorithm.

A dictionary-based sparse representation algorithm using the phase-sensitive SSIM for restoration of complex-valued images is described below.

Image restoration based on sparse representation may be formulated as the following optimization problem:

$$\hat{\alpha}_{ij} = \underset{\alpha}{\mathrm{argmin}} \mu_{ij} \|\alpha\|_0 + (1 - S(\Psi\alpha, R_{ij}X))$$

$$\hat{X} = \underset{X}{\mathrm{argmax}} S(W, X) + \lambda S(DX, Y)$$

where Y is a complex-valued distorted image (e.g., blurred or down-sampled), $\hat{X}$ is a complex-valued restored image, $\Psi$ is a n×k matrix that contains a dictionary (for example, based on complex wavelet transform or discrete Fourier transform) with k>n, $R_{ij}$ is a matrix that extracts the (ij)th block from an image, $\hat{\alpha}_{ij}$ is a sparse vector of coefficients for the (ij)th block, S(•,•) is the phase-sensitive SSIM, $\lambda$ and $\mu_{ij}$ are regularization parameters, W is an image obtained from combining image blocks $\Psi\hat{\alpha}_{ij}$, and D is a distortion operator (for example, blurring or down-sampling).

Given a complex-valued distorted image Y, a complex-valued restored image $\hat{X}$ may be obtained as follows. $\hat{X}$ is initialized using the distorted image Y. The coefficients $\hat{\alpha}_{ij}$ are calculated using Orthogonal Matching Pursuit. A restored image $\hat{X}$ is updated using a gradient ascent algorithm. Calculating coefficients $\hat{\alpha}_{ij}$ and updating restored image $\hat{X}$ are repeated for a predetermined number of times or until a certain convergence criterion is satisfied. The restored image $\hat{X}$ is displayed.

Image Registration

The phase-sensitive SSIM (PS-SSIM) may be used for image registration for complex-valued images.

Suppose a complex-valued image X is to be deformed to match a complex-valued target image T. Suppose $M_\theta$ is a deformation operator where $\theta$ is a deformation parameter. The deformation operator may model rigid-body or non-rigid-body deformation. Image registration is equivalent to the following optimization problem:

$$\hat{\theta} = \underset{\theta}{\mathrm{argmax}} S(M_\theta(X), T) - R(\theta)$$

where S(•,•) is the phase-sensitive SSIM and R is a regularization function for deformation. Image registration may be performed as follows. A complex-valued target image T and an image X to be registered to T are given. A deformation parameter $\hat{\theta}$ is calculated using a gradient ascent algorithm. The image X is deformed using the deformation parameter $\hat{\theta}$ as $M_\theta(X)$ and is displayed.

Figure 4A:
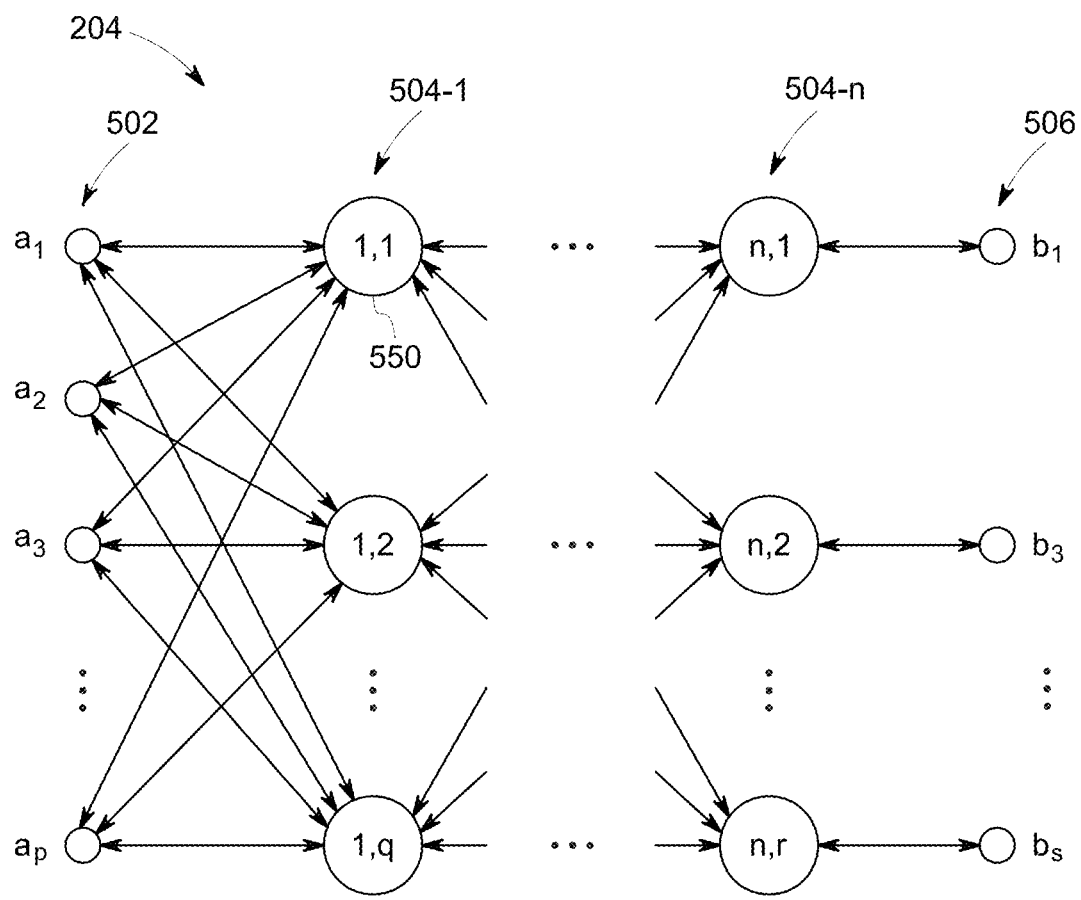
FIG. 4A is a schematic diagram of a neural network.

FIG. 4A depicts an exemplary artificial neural network model 204 used in the system 200. The exemplary neural network model 204 includes layers of neurons 502, 504-1 to 504-n, and 506, including an input layer 502, one or more hidden layers 504-1 through 504-n, and an output layer 506. Each layer may include any number of neurons, i.e., q, r, and n in FIG. 4A may be any positive integers. It should be understood that neural networks of a different structure and configuration from that depicted in FIG. 4A may be used to achieve the methods and systems described herein.

In the exemplary embodiment, the input layer 502 may receive different input data. For example, the input layer 502 includes a first input $a_1$ representing training images, a second input $a_2$ representing patterns identified in the training images, a third input $a_3$ representing edges of the training images, and so on. The input layer 502 may include thousands or more inputs. In some embodiments, the number of elements used by the neural network model 204 changes during the training process, and some neurons are bypassed or ignored if, for example, during execution of the neural network, they are determined to be of less relevance.

In the exemplary embodiment, each neuron in hidden layer(s) 504-1 through 504-n processes one or more inputs from the input layer 502, and/or one or more outputs from neurons in one of the previous hidden layers, to generate a decision or output. The output layer 506 includes one or more outputs each indicating a label, confidence factor, weight describing the inputs, and/or an output image. In some embodiments, however, outputs of the neural network model 204 are obtained from a hidden layer 504-1 through 504-n in addition to, or in place of, output(s) from the output layer(s) 506.

In some embodiments, each layer has a discrete, recognizable function with respect to input data. For example, if n is equal to 3, a first layer analyzes the first dimension of the inputs, a second layer the second dimension, and the final layer the third dimension of the inputs. Dimensions may correspond to aspects considered strongly determinative, then those considered of intermediate importance, and finally those of less relevance.

In other embodiments, the layers are not clearly delineated in terms of the functionality they perform. For example, two or more of hidden layers 504-1 through 504-n may share decisions relating to labeling, with no single layer making an independent decision as to labeling.

Figure 4B:
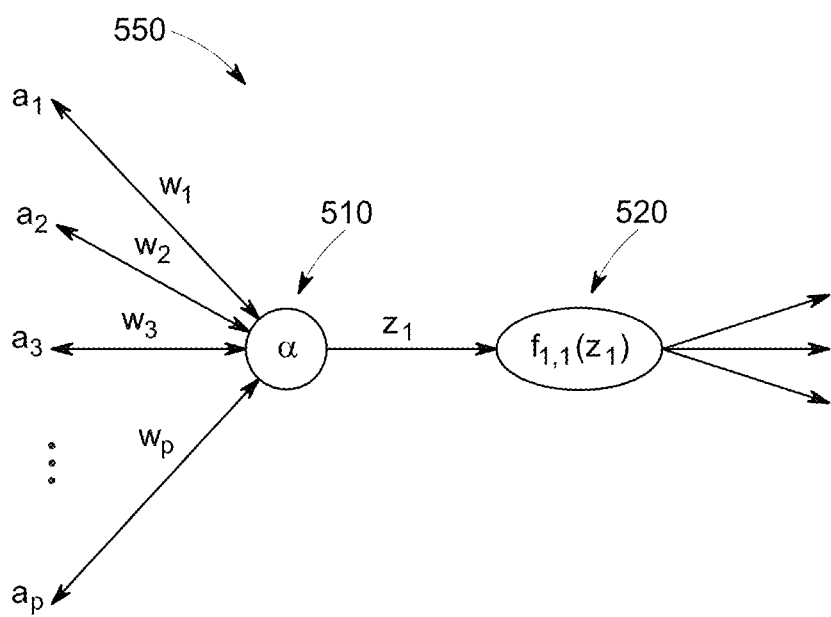
FIG. 4B is a schematic diagram of a neuron in the neural network shown in FIG. 4A.

FIG. 4B depicts an example neuron 550 that corresponds to the neuron labeled as "1,1" in hidden layer 504-1 of FIG. 4A, according to one embodiment. Each of the inputs to the neuron 550 (e.g., the inputs in the input layer 502 in FIG. 4A) is weighted such that input $a_1$ through $a_p$ corresponds to weights $w_1$ through $w_p$ as determined during the training process of the neural network model 204.

In some embodiments, some inputs lack an explicit weight, or have a weight below a threshold. The weights are applied to a function $\alpha$ (labeled by a reference numeral 510), which may be a summation and may produce a value $z_1$ which is input to a function 520, labeled as $f_{1,1}(z_1)$. The function 520 is any suitable linear or non-linear function. As depicted in FIG. 4B, the function 520 produces multiple outputs, which may be provided to neuron(s) of a subsequent layer, or used as an output of the neural network model 204. For example, the outputs may correspond to index values of a list of labels, or may be calculated values used as inputs to subsequent functions.

It should be appreciated that the structure and function of the neural network model 204 and the neuron 550 depicted are for illustration purposes only, and that other suitable configurations exist. For example, the output of any given neuron may depend not only on values determined by past neurons, but also on future neurons.

The neural network model 204 may include a convolutional neural network (CNN), a deep learning neural network, a reinforced or reinforcement learning module or program, or a combined learning module or program that learns in two or more fields or areas of interest. Supervised and unsupervised machine learning techniques may be used. In supervised machine learning, a processing element may be provided with example inputs and their associated outputs, and may seek to discover a general rule that maps inputs to outputs, so that when subsequent novel inputs are provided the processing element may, based upon the discovered rule, accurately predict the correct output. The neural network model 204 may be trained using unsupervised machine learning programs. In unsupervised machine learning, the processing element may be required to find its own structure in unlabeled example inputs. Machine learning may involve identifying and recognizing patterns in existing data in order to facilitate making predictions for subsequent data. Models may be created based upon example inputs in order to make valid and reliable predictions for novel inputs.

Additionally or alternatively, the machine learning programs may be trained by inputting sample data sets or certain data into the programs, such as images, object statistics, and information. The machine learning programs may use deep learning algorithms that may be primarily focused on pattern recognition, and may be trained after processing multiple examples. The machine learning programs may include Bayesian Program Learning (BPL), voice recognition and synthesis, image or object recognition, optical character recognition, and/or natural language processing—either individually or in combination. The machine learning programs may also include natural language processing, semantic analysis, automatic reasoning, and/or machine learning.

Based upon these analyses, the neural network model 204 may learn how to identify characteristics and patterns that may then be applied to analyzing image data, model data, and/or other data. For example, the model 204 may learn to identify features in a series of data points.

Figure 5:
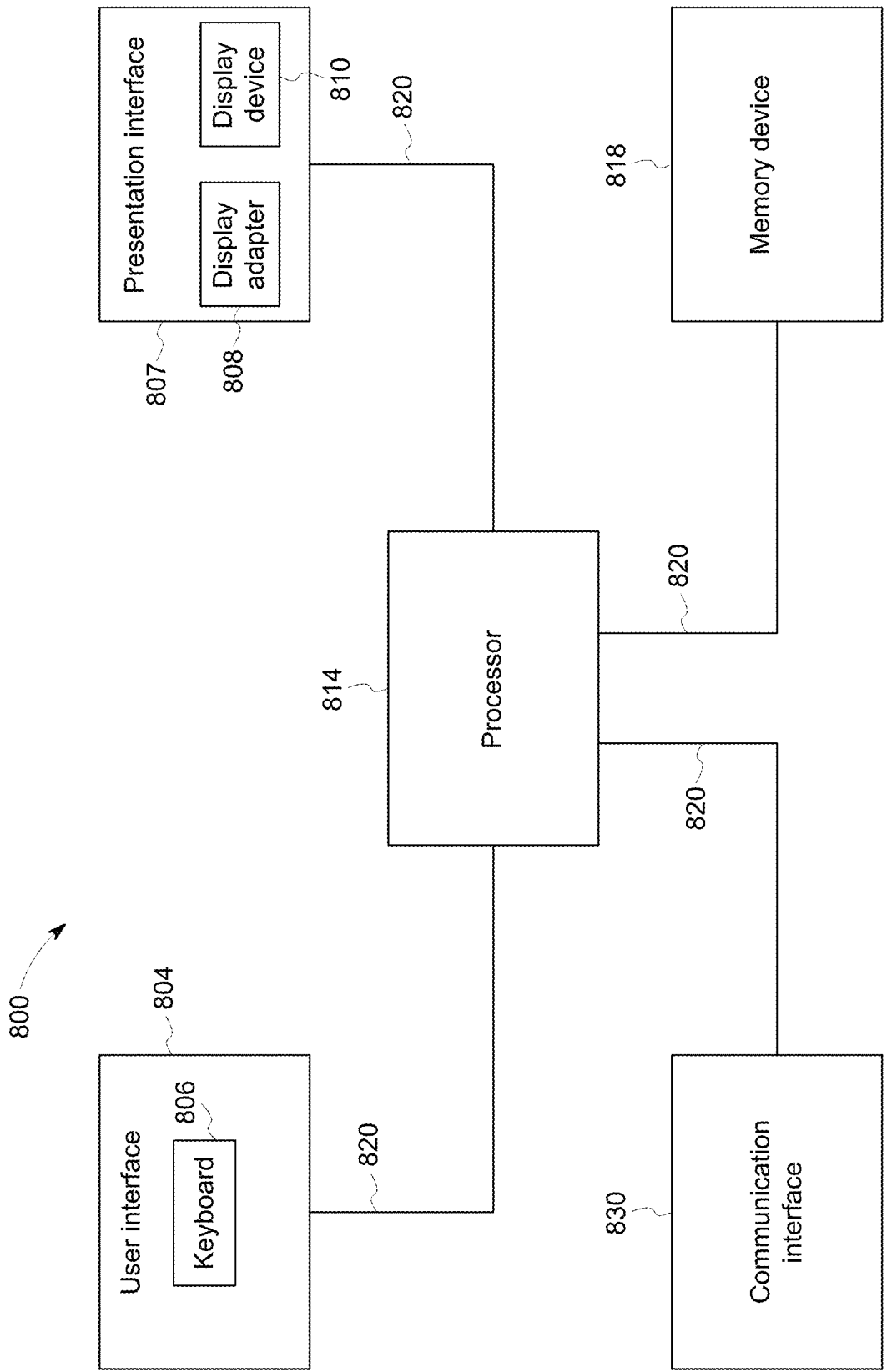
FIG. 5 is a block diagram of an exemplary user computing device.

The computing device 202, 203 and the workstation 12 described herein may be any suitable computing device 800 and software implemented therein. FIG. 5 is a block diagram of an exemplary computing device 800. In the exemplary embodiment, the computing device 800 includes a user interface 804 that receives at least one input from a user. The user interface 804 may include a keyboard 806 that enables the user to input pertinent information. The user interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 800 includes a presentation interface 807 that presents information, such as input events and/or validation results, to the user. The presentation interface 807 may also include a display adapter 808 that is coupled to at least one display device 810. More specifically, in the exemplary embodiment, the display device 810 may be a visual display device, such as a cathode ray tube (CRT), a liquid crystal display (LCD), a light-emitting diode (LED) display, and/or an "electronic ink" display. Alternatively, the presentation interface 807 may include an audio output device (e.g., an audio adapter and/or a speaker) and/or a printer.

The computing device 800 also includes a processor 814 and a memory device 818. The processor 814 is coupled to the user interface 804, the presentation interface 807, and the memory device 818 via a system bus 820. In the exemplary embodiment, the processor 814 communicates with the user, such as by prompting the user via the presentation interface 807 and/or by receiving user inputs via the user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, the memory device 818 includes one or more devices that enable information, such as executable instructions and/or other data, to be stored and retrieved. Moreover, the memory device 818 includes one or more computer readable media, such as, without limitation, dynamic random access memory (DRAM), static random access memory (SRAM), a solid state disk, and/or a hard disk. In the exemplary embodiment, the memory device 818 stores, without limitation, application source code, application object code, configuration data, additional input events, application states, assertion statements, validation results, and/or any other type of data. The computing device 800, in the exemplary embodiment, may also include a communication interface 830 that is coupled to the processor 814 via the system bus 820. Moreover, the communication interface 830 is communicatively coupled to data acquisition devices.

In the exemplary embodiment, the processor 814 may be programmed by encoding an operation using one or more executable instructions and providing the executable instructions in the memory device 818. In the exemplary embodiment, the processor 814 is programmed to select a plurality of measurements that are received from data acquisition devices.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Figure 6:
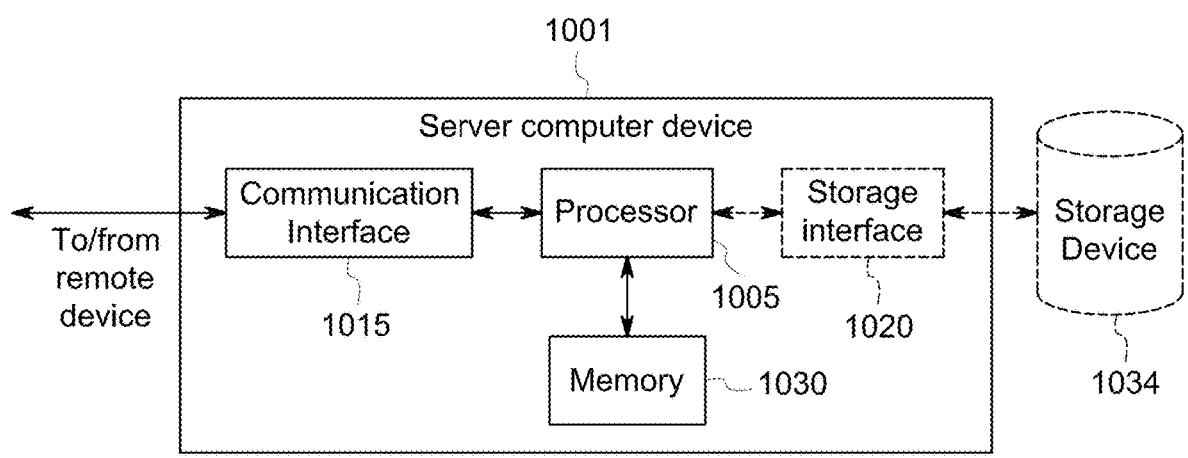
FIG. 6 is a block diagram of an exemplary server computing device.

FIG. 6 illustrates an exemplary configuration of a server computing device 1001 such as a cloud-based image processing computing device 202, 203. The server computing device 1001 also includes a processor 1005 for executing instructions. Instructions may be stored in a memory area 1030, for example. The processor 1005 may include one or more processing units (e.g., in a multi-core configuration).

The processor 1005 is operatively coupled to a communication interface 1015 such that the server computing device 1001 is capable of communicating with a remote device or another server computing device 1001 to receive and output data and/or command.

The processor 1005 may also be operatively coupled to a storage device 1034. The storage device 1034 is any computer-operated hardware suitable for storing and/or retrieving data, such as, but not limited to, wavelength changes, temperatures, humidity, carbon dioxide levels, and/or proximity. In some embodiments, the storage device 1034 is integrated in the server computing device 1001. For example, the server computing device 1001 may include one or more hard disk drives as the storage device 1034. In other embodiments, the storage device 1034 is external to the server computing device 1001 and may be accessed by a plurality of server computing devices 1001. For example, the storage device 1034 may include multiple storage units such as hard disks and/or solid state disks in a redundant array of inexpensive disks (RAID) configuration. The storage device 1034 may include a storage area network (SAN) and/or a network attached storage (NAS) system.

In some embodiments, the processor 1005 is operatively coupled to the storage device 1034 via a storage interface 1020. The storage interface 1020 is any component capable of providing the processor 1005 with access to the storage device 1034. The storage interface 1020 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing the processor 1005 with access to the storage device 1034.

At least one technical effect of the systems and methods described herein includes (a) provision of a PS-SSIM that considers phases of images, (b) training of a neural network model using a PS-SSIM as a loss function, and (c) increased image quality of processed complex images.

Exemplary embodiments of systems and methods of image processing are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computer-implemented method of processing complex magnetic resonance (MR) images, comprising:
   receiving a pair of corrupted complex data and pristine complex images corresponding to the corrupted complex data; and
   training a neural network model using the pair of corrupted complex data and pristine complex images by:
      inputting the corrupted complex data to the neural network model;
      setting the pristine complex images as target outputs of the neural network model;
      processing the corrupted complex data using the neural network model to derive output complex images of the corrupted complex data;
      comparing the output complex images with the target outputs by computing a phase-sensitive structural similarity index measure (PS-SSIM) between each of the output complex images and its corresponding target complex image, wherein the PS-SSIM is real-valued and varies with phases of the output complex image and phases of the target complex image; and
      adjusting the neural network model based on the comparison.

2. The method of claim 1, wherein the PS-SSIM includes a luminance comparison function, the luminance comparison function varying with the phases of the output complex image and the phases of the target complex image.

3. The method of claim 2, wherein the luminance comparison function reaches a maximum when means of image patches in the output complex image are equal to means of image patches in the target complex image.

4. The method of claim 2, wherein the luminance comparison function reaches a maximum when means of real components of image patches in the output complex image are equal to means of real components of image patches in the target complex image and means of imaginary components of image patches in the output complex image are equal to means of imaginary components of image patches in the target complex image.

5. The method of claim 1, wherein the PS-SSIM includes a contrast comparison function, the contrast comparison function varying with the phases of the output complex image and the phases of the target complex image.

6. The method of claim 5, wherein the contrast comparison function reaches a maximum when standard deviations of image patches in the output complex image are equal to standard deviations of image patches in the target complex image.

7. The method of claim 5, wherein the contrast comparison function reaches a maximum when standard deviations of real components of image patches in the output complex image are equal to standard deviations of real components of image patches in the target complex image and standard deviations of imaginary components of image patches in the output complex image are equal to standard deviations of imaginary components of image patches in the target complex image.

8. The method of claim 1, wherein the PS-SSIM includes a structure comparison function, the structure comparison function varying with phases of the output complex image and phases of the target complex image.

9. The method of claim 8, wherein the structure comparison function reaches a maximum when real components of image patches in the output complex image are linearly dependent upon real components of image patches in the target complex image and imaginary components of image patches in the output complex image are linearly dependent upon imaginary components of image patches in the target complex image.

10. The method of claim 8, wherein the structure comparison function reaches a maximum when image patches in the output complex image are linearly dependent upon image patches in the target complex image.

11. The method of claim 8, wherein the structure comparison function reaches a maximum when real components of image patches in the output complex image are positively fully correlated with real components of image patches in the target complex image and imaginary components of image patches in the output complex image are positively fully correlated with imaginary components of image patches in the target complex image.

12. The method of claim 8, wherein the structure comparison function reaches a maximum when image patches in the output complex image are positively fully correlated with image patches in the target complex image.

13. An image processing system, comprising an image processing computing device, the image processing computing device comprising at least one processor in communication with at least one memory device, and the at least one processor programmed to:
  receive a pair of corrupted complex data and pristine complex images corresponding to the corrupted complex data; and
  train a neural network model using the pair of corrupted complex data and pristine complex images by:
    inputting the corrupted complex data to the neural network model;
    setting the pristine complex images as target outputs of the neural network model;
    processing the corrupted complex data using the neural network model to derive output complex images of the corrupted complex data;
    comparing the output complex images with the target outputs by computing a phase-sensitive structural similarity index measure (PS-SSIM) between each of the output complex images and its corresponding target complex image, wherein the PS-SSIM is real-valued and varies with phases of the output complex image and phases of the target complex image; and
    adjusting the neural network model based on the comparison.

14. The system of claim 13, wherein the PS-SSIM includes a luminance comparison function, the luminance comparison function varying with the phases of the output complex image and the phases of the target complex image.

15. The system of claim 14, wherein the luminance comparison function reaches a maximum when means of image patches in the output complex image are equal to means of image patches in the target complex image.

16. The system of claim 13, wherein the PS-SSIM includes a contrast comparison function, the contrast comparison function varying with the phases of the output complex image and the phases of the target complex image.

17. The system of claim 16, wherein the contrast comparison function reaches a maximum when standard deviations of image patches in the output complex image are equal to standard deviations of image patches in the target complex image.

18. The system of claim 13, wherein the PS-SSIM include a structure comparison function, the structure comparison function varying with phases of the output complex image and phases of the target complex image.

19. The system of claim 18, wherein the structure comparison function reaches a maximum when real components of image patches in the output complex image are linearly dependent upon real components of image patches in the target complex image and imaginary components of image patches in the output complex image are linearly dependent upon imaginary components of image patches in the target complex image.

20. An image processing system, comprising an image processing computing device, the image processing computing device comprising at least one processor in communication with at least one memory device, and the at least one processor programmed to:
  receive crude complex data;
  process the crude complex data using a neural network model, wherein the neural network model was trained with a pair of corrupted complex data and pristine complex images with the corrupted complex data as inputs and the pristine complex images as target outputs, and a loss function of the neural network model that compares outputs of the neural network model and the target outputs of the neural network model includes a phase-sensitive structural similarity index measure (PS-SSIM) between each of the output complex images and its corresponding target complex image, wherein the PS-SSIM is real-valued and varies with phases of the output complex image and phases of the target complex image;
  generate a predicted image of the crude complex data based on the processing; and
  output the predicted image.

* * * * *

UNITED STATES PATENT AND TRADEMARK OFFICE
CERTIFICATE OF CORRECTION

| | | |
|---|---|---|
| PATENT NO. | : 11,756,197 B2 | Page 1 of 1 |
| APPLICATION NO. | : 17/197854 | |
| DATED | : September 12, 2023 | |
| INVENTOR(S) | : Sangtae Ahn et al. | |

It is certified that error appears in the above-identified patent and that said Letters Patent is hereby corrected as shown below:

On the Title Page

Under "Inventors", delete "Graeme C. Mckinnon" and insert therefor -- Graeme C. McKinnon --.

Signed and Sealed this
Second Day of January, 2024

Katherine Kelly Vidal
*Director of the United States Patent and Trademark Office*